(12) United States Patent
Kim

(10) Patent No.: US 7,355,286 B2
(45) Date of Patent: Apr. 8, 2008

(54) FLIP CHIP BONDED PACKAGE APPLICABLE TO FINE PITCH TECHNOLOGY

(75) Inventor: Seong Cheol Kim, Gyeongsangnam-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 10 days.

(21) Appl. No.: 11/485,226

(22) Filed: Jul. 12, 2006

(65) Prior Publication Data

US 2007/0228564 A1    Oct. 4, 2007

(30) Foreign Application Priority Data

Mar. 29, 2006    (KR) ............... 10-2006-0028525

(51) Int. Cl.
*H01L 23/48* (2006.01)
*H01L 23/52* (2006.01)
*H01L 29/40* (2006.01)

(52) U.S. Cl. .................................... 257/778
(58) Field of Classification Search ........... 438/123, 438/106; 257/686, 778
See application file for complete search history.

(56) References Cited

U.S. PATENT DOCUMENTS 5,656,550 A * 8/1997 Tsuji et al. ............ 438/123
6,177,721 B1 * 1/2001 Suh et al. .............. 257/686
2005/0064624 A1 * 3/2005 Murakami ............ 438/106

FOREIGN PATENT DOCUMENTS

| JP | 2003-142512 | 5/2003 |
|---|---|---|
| KR | 10-1997-0053166 | 7/1997 |
| KR | 10-2004-0023501 | 3/2004 |
| KR | 10-2006-0041453 | 5/2006 |

OTHER PUBLICATIONS

Korean Patent Gazettle from the Korean Patent Office.

* cited by examiner

*Primary Examiner*—Thao X. Le
*Assistant Examiner*—Monica Harrison
(74) *Attorney, Agent, or Firm*—Ladas & Parry LLP

(57) ABSTRACT

A flip chip bonded package applicable to a fine pitch technology uses, inter alia, insulative posts instead of using conductive bumps, which correspond to electrodes one by one. The insulative posts are assigned to every two bonding pads for the sake of flip chip bonding. This makes it possible to fabricate flip chip bonded packages very easily without modifying conventional processes. Larger bumps are provided even in the case of a technology having the same pad size and pitch during flip chip bonding. This makes the subsequent attachment process easy and reduces the defective ratio. The insulative posts, when made of a polymer, also act as stress buffers. This improves the reliability of the package.

10 Claims, 5 Drawing Sheets ns. This increases the
FLIP CHIP BONDED PACKAGE APPLICABLE TO FINE PITCH TECHNOLOGY

BACKGROUND OF THE INVENTION

1. Field of the Invention

The present invention relates generally to a semiconductor package, and more particularly to a flip chip bonded package applicable to a fine pitch technology.

2. Description of the Prior Art

As generally known in the art, the semiconductor packaging technologies have been developing towards mounting a greater number of packages on a substrate of a limited size, thereby reducing the overall size of the packages. For example, various types of chip size packages (hereinafter referred to as "CSPs") have been developed to reduce the size of semiconductor chips to at least 80% of the overall size of the packages. In general, the CSPs are considered more advantageous in that than other types of the conventional semiconductor packages, because the CSPs allow a greater number of packages to be mounted on a substrate of a limited size, thereby realizing more compact and high-capacity semiconductor memory product.

In addition to reducing the size of packages, recent packaging technologies are also directed to mounting 2-4 semiconductor chips in a single package for higher capacity.

The CSPs and stack packages are generally mounted on a substrate during fabrication, and a wire bonding process is used to electrically connect semiconductor chips to the substrate.

However, when wire bonding is used for electrical connection inside a package, the bonding wires could be cut off or severed in a subsequent molding process. In addition, the package size is reduced by the loop of the bonding wires, as well as by their length. Particularly, the length of signal transmission paths in a package using wire bonding is determined by the length of the bonding wires. This makes it difficult to secure the desired electrical properties of the package.

In an attempt to solve these problems, a conventional flip chip bonding technology has been proposed, in which the semiconductor chips are connected to a substrate using bumps. According to the flip chip bonding technology, semiconductor chips are mechanically attached to a substrate via bumps, which are formed on the bonding pads of the semiconductor chips, while being electrically connected to electrodes on the substrate.

More specifically, FIG. 1 is a cross-sectional view showing a conventional flip chip bonded package. Referring to FIG. 1, a semiconductor chip 10 is attached to a substrate 20 via solder bumps 14, which are formed on a bonding pad 12 of the semiconductor chip 10, while being electrically connected to electrodes 22 on the substrate 20 by the solder bumps 14. A filler 30 is used to underfill the space between the semiconductor chip 10 and the substrate 20. Solder balls 40 are attached to ball lands 24 on a lower surface of the substrate 20 so that the package can be mounted on an external circuit via the solder balls 40. In FIG. 1, reference numeral 26 refers to solder resist.

The flip chip bonded package, to which the flip chip bonding technology has been applied, has a smaller package height than in the case of using a wire bonding technology, because solder bumps are used for electrical and mechanical connection. Furthermore, shorter signal transmission paths improve the electrical properties.

However, in the case of a conventional flip chip bonded package, the substrate must have electrodes (such as FIG. 1, element 22), which correspond to the solder bumps one by one, for the purpose of electrical connection. When the electrodes have a narrow pitch, it is difficult to define the photoresist for plating the solder bumps. This increases the possibility of a short circuit occurring between the solder bumps.

In order to avoid these problems, it is necessary to modify the substrate design or perform expensive processes. In addition, the bonding pads must be rearranged on the chips in an inefficient manner. This increases the cost for manufacturing products and degrades the competitiveness.

SUMMARY OF THE INVENTION

Accordingly, the present invention has been made to solve the above-mentioned problems occurring in the prior art, and an object of the present invention is to provide a flip chip bonded package capable of preventing a short circuit even when electrodes on a substrate have a fine pitch.

Another object of the present invention is to provide a flip chip bonded package adapted to be manufactured easily.

Still another object of the present invention is to provide a flip chip bonded package capable of improving the competitiveness of products.

In order to accomplish these objects, there is provided a flip chip bonded package including a semiconductor chip having a number of bonding pads arranged in a row on an upper surface; a number of insulative posts formed on a part of the semiconductor chip, the bonding pads being formed on the part, so as to cover regions between every two adjacent bonding pads and parts of the bonding pads; a number of signal connection metal members formed on parts of the bonding pads, the part not being covered with the insulative posts, and on parts of the insulative posts adjacent to the parts of the bonding pads; a substrate having a number of electrodes positioned on an upper surface so as to be electrically connected to the signal connection metal members and a number of ball lands positioned on a lower surface so as to be connected to the electrodes, respectively, the semiconductor chip being flip-chip-bonded to the substrate by the signal connection metal members; a filler underfilling a space between the semiconductor chip and the substrate; and a number of solder balls attached to the ball lands on the lower surface of the substrate, respectively.

The insulative posts are made of a polymer and have an additional role of stress buffers.

The electrodes of the substrate are designed so as to have a fine pitch. The upper surface of the substrate, except the electrodes, is covered with solder paste.

The flip chip bonded package further includes solder bumps formed on the signal connection metal members.

In accordance with another aspect of the present invention, there is provided a flip chip bonded package including a semiconductor chip having a number of bonding pads arranged in two rows on an upper surface in a zigzag pattern; a number of insulative posts formed on a part of the semiconductor chip, the bonding pads being formed on the part, so as to cover regions among every three bonding pads and parts of the bonding pads; a number of signal connection metal members formed on parts of the bonding pads, the part not being covered with the insulative posts, and on parts of the insulative posts adjacent to the parts of the bonding pads; a substrate having a number of electrodes positioned on an upper surface so as to be electrically connected to the signal connection metal members and a number of ball lands positioned on a lower surface so as to be connected to the electrodes, respectively, the semiconductor chip being flip-chip-bonded to the substrate by the signal connection metal members; a filler underfilling a space between the semiconductor chip and the substrate; and a number of solder balls attached to the ball lands on the lower surface of the substrate, respectively.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
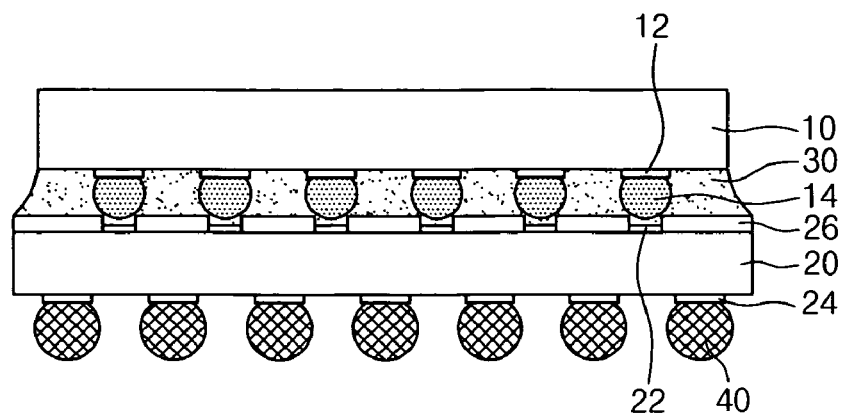
FIG. 1 is a cross-sectional view showing a conventional flip chip bonded package.

Hereinafter, a preferred embodiment of the present invention will be described with reference to the accompanying drawings. In the following description and drawings, the same reference numerals are used to designate the same or similar components, and so repetition of the description on the same or similar components will be omitted.

The technical principle of the present invention is as follows. The present invention uses an insulative material, not a conductive material, for bumps when using a flip chip bonding technology. In addition, each bump, which is made of an insulative material, is formed so as to cover a region between two adjacent bonding pads and parts of both bonding pads. For electrical connection, signal connection metal members are formed on remaining parts of the bonding pads, which are not covered by the insulative bumps.

As such, the present invention is less affected by limits of the chip pad pitch, so that a technology using a narrow pad pitch can be applied. Particularly, the present invention can easily fabricate not only the semiconductor chips having a narrow pad pitch, but also the substrates having a narrow pad pitch. In addition, the present invention can provide larger bumps even with a technology having the same pad size and pitch during flip chip bonding. The resulting increase in attachment area of the bumps makes the process easy and reduces the defective ratio.

As a result, the present invention increases the yield ratio when a flip chip bonding technology is used, and reduces the process time. This makes it possible to timely develop a high value-added product.

A flip chip bonded package according to an embodiment of the present invention will now be described in detail with reference to FIG. 2, which is a cross-sectional view showing the same.

Figure 2:
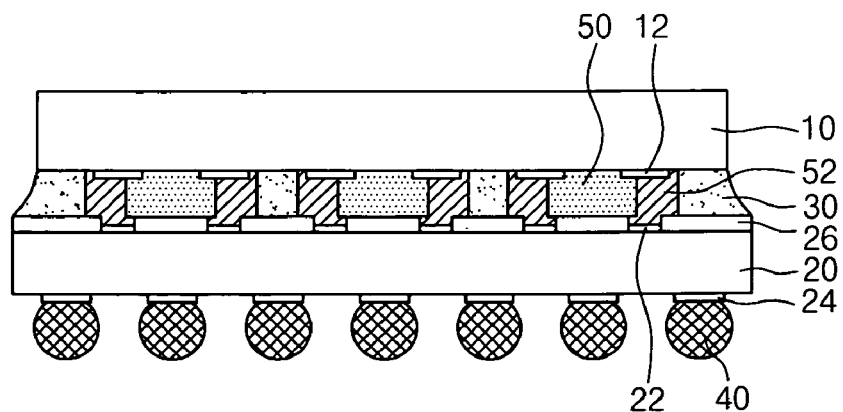
FIG. 2 is a cross-sectional view showing a flip chip bonded package according to an embodiment of the present invention.

Referring to FIG. 2, a flip chip bonded package according to an embodiment of the present invention includes a semiconductor chip 10; a number of bonding pads 12 positioned on a surface of the semiconductor chip 10; bumps, particularly insulative posts 50, made of an insulative material and positioned on the surface of the semiconductor chip 10, on which the bonding pads 12 are positioned, together with conductive signal connection metal members 52 so that the semiconductor chip 10 is flip-chip-bonded to a substrate 20; a filler 30 underfilling the space between the semiconductor chip 10 and the substrate 20; and solder balls 40 attached to the bottom surface of the substrate 20 so that the package can be mounted on an external circuit via the solder balls 40.

The semiconductor chip 10 is a center pad type chip, for example, having bonding pads 12 arranged in a row on the upper surface thereof. Each insulative post 50 is formed so as to cover a region between two adjacent bonding pads 12 of the semiconductor chip 10 and parts of both bonding pads 12. Particularly, the insulative posts 50 are made of a polymer so that they also act as stress buffers, in order to improve the reliability of the package. The conductive signal connection metal members 52 are substantial electrical connection means for electrically connecting the semiconductor chip 10 to the substrate 20. The conductive signal connection metals 52 are formed on parts of the bonding pads 12, which are exposed, as well as on parts of the insulative posts, which are adjacent to the exposed parts.

The substrate 20 has a number of electrodes 22 formed on its upper surface so as to be electrically connected to the signal connection metal members 52 and a number of ball lands 24 formed on the lower surface so as to be connected to the electrodes 22, respectively. The upper surface of the substrate 20, except the electrodes 22, is covered with solder resist 26. The filler 30 is, for example, EMC and protects parts of the semiconductor chip 10 and the substrate 20, which are electrically connected to each other, from external influences. The solder balls 40 are attached to the ball lands 24 on the lower surface of the substrate 20 so that the package can be mounted on an external circuit via the solder balls 40.

It is to be noted that, in the case of a flip chip bonded package according to an embodiment of the present invention, the bonding pads 12 of the semiconductor chip do not necessarily correspond to the electrodes 22 of the substrate 20 one by one for the sake of interconnection. Instead, the insulation posts 50 and signal connection metal members 52, which span every two adjacent bonding pads 12, connect the bonding pads 12 to the electrodes 22. This makes it possible to apply a fine pitch technology to the substrate. In summary, the flip chip bonded package as shown and described according to an embodiment of the present invention guarantees stable electrical connection between the semiconductor chip 10 and the substrate 20 while preventing a short circuit by using insulative posts 50 and signal connection metal members 52, even when the electrodes 22 of the substrate 20 have a fine pitch.

The process for forming bumps, including the insulative posts and the signal connection patterns, when a flip chip bonded package according to the present invention is manufactured is now be described.

Figure 3A:
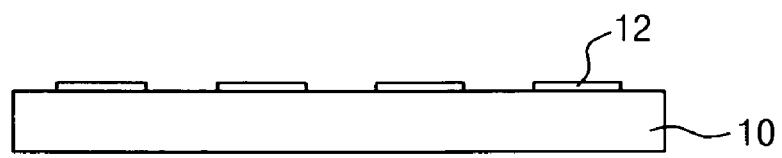
FIGS. 3A to 3C are cross-sectional views showing a method for forming bumps on a flip chip bonded package according to an embodiment of the present invention.
Figure 3B:
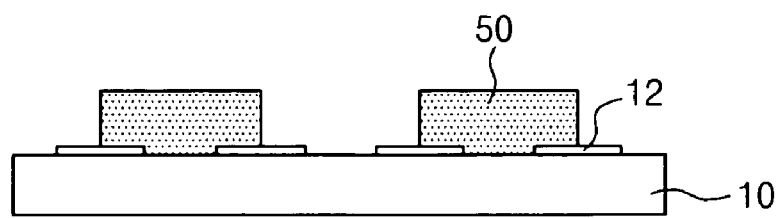
Figure 3C:
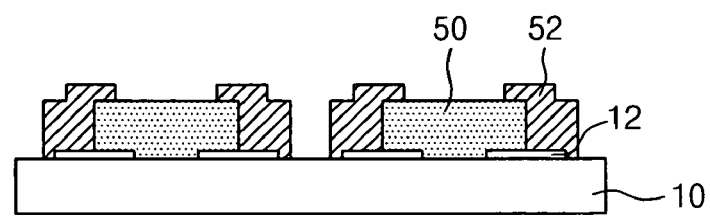

FIGS. 3A to 3C are cross-sectional views drawn for showing a method for forming bumps on a flip chip bonded package according to an embodiment of the present invention, and FIG. 4 is a top view corresponding to FIGS. 3A to 3C.

Figure 4A:
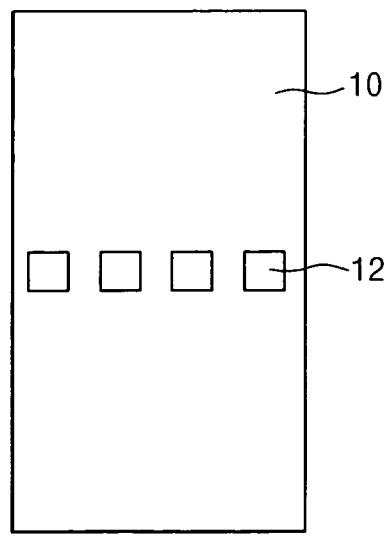
FIGS. 4A to 4C are top views corresponding to FIGS. 3A to 3C, respectively.

Referring to FIGS. 3A and 4A, bonding pads 12 are arranged in a row on an upper surface of a semiconductor chip 10.

Figure 4B:
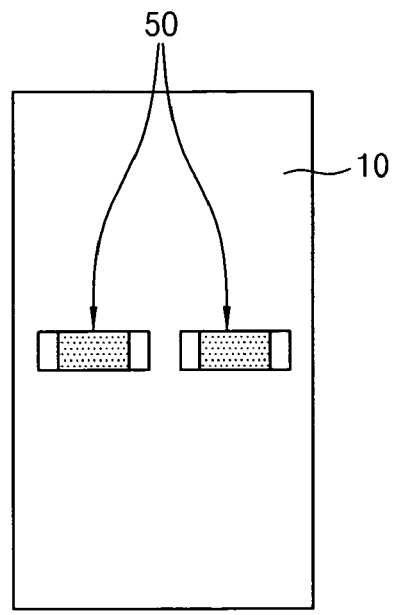

Referring to FIGS. 3B and 4B, insulative posts 50 are formed on the upper surface of the semiconductor chip 10 in such a manner that each insulative post 50 covers a region between two adjacent bonding pads 12, 12 and parts of both bonding pads 12, 12. The insulative posts 50 are preferably made of a polymer so that they also act as stress buffers.

Figure 4C:
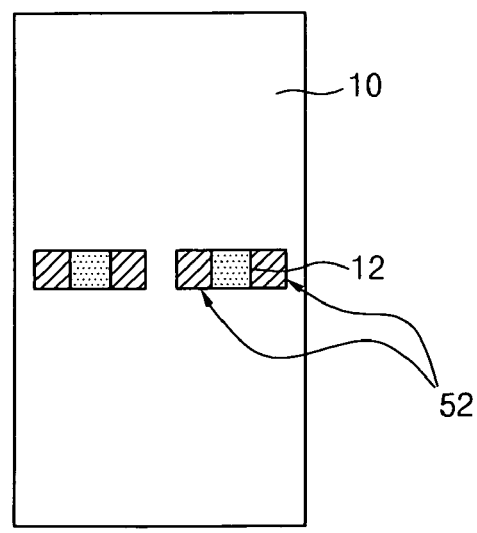

Referring to FIGS. 3C and 4C, a metal layer is deposited on the upper surface of the semiconductor chip 10, including the insulative posts 50. Then, the metal layer is patterned so as to form signal connection metal members 52 on parts of the bonding pads 12, which are not covered with the insulative posts 50, and on parts of the insulative posts 50, which are adjacent to the uncovered parts, in order to form bumps.

The bumps are used to flip-chip-bond the semiconductor chip to a substrate. Thereafter, underfilling and solder ball attachment processes are performed successively. In this manner, a flip chip bonded package according to the present invention is completed.

Although not shown nor described with reference to the above-mentioned embodiment of the present invention, solder paste may be applied to the signal connection metal members during flip chip bonding of the bumps, which include insulative posts and signal connection metal members, and hardened for complete electrical connection.

Alternatively, solder bumps may be additionally formed on the signal connection metal members, instead of the solder paste, for complete electrical connection.

Although the insulative posts and signal connection metal members are assigned to every two adjacent bonding pads in the above-mentioned embodiment, the insulative posts and signal connection metal members may be assigned to more than two (e.g. three) bonding pads.

Figure 5:
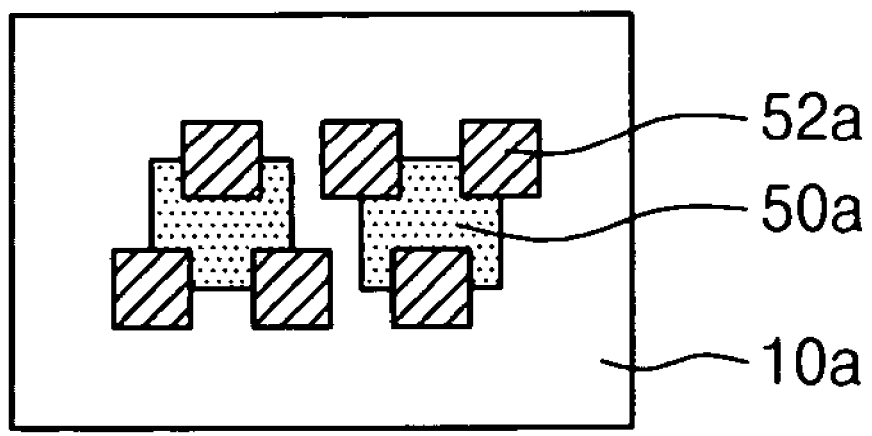
FIG. 5 briefly shows a flip chip bonded package, which has bumps formed thereon, according to another embodiment of the present invention.

FIG. 5 briefly shows a flip chip bonded package, which has bumps formed thereon, according to another embodiment of the present invention. Referring to FIG. 5, bonding pads (not shown) are arranged in two rows on an upper surface of a semiconductor chip 10a in a zigzag pattern. Insulative posts 50a are formed in such a manner that each insulative post 50a covers a region among three bonding pads and parts of the three bonding pads, and signal connection metal members 52a are formed on parts of the bonding pads, which are exposed, and parts of the insulative posts, which are adjacent to the exposed parts.

Although not shown and described, it can be easily understood by those skilled in the art that the present embodiment has the same components as the previous embodiment, except for the insulative posts 50a and signal connection metal members 52a.

The flip chip bonded package according to the present embodiment guarantees stable electrical connection between the semiconductor chip and the substrate without a short circuit by using insulative posts and signal connection metal members, as in the case of the previous embodiment. This makes it possible to overcome the limits of a fine chip pad pitch.

As mentioned above, the present invention is advantageous in that, instead of using conductive bumps, which correspond to the electrodes one by one, insulative posts are assigned to every two bonding pads for the sake of flip chip bonding. This makes it possible to fabricate flip chip bonded packages very easily without modifying conventional processes.

The present invention can overcome the limits of the pad pitch and is applicable to a fine pitch technology for semiconductor chips and substrates. This improves the competitiveness of products.

The present invention advances the application of a flip chip technology to the semiconductor memory field, due to easy application to a fine pitch.

The present invention can provide larger bumps even in the case of a technology having the same pad size and pitch during flip chip bonding. This makes the subsequent attachment process easy and reduces the defective ratio.

The insulative posts, when made of a polymer, also act as stress buffers. This improves the reliability of the package.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A flip chip bonded package comprising:
a semiconductor chip having a plurality of bonding pads being arranged on a surface of the semiconductor chip;
a plurality of insulative posts, each insulative post being formed on a part of the surface of the semiconductor chip between adjacent bonding pads and each insulative post also being formed on a first portion of each bonding pad of the adjacent bonding pads, wherein a second portion of each bonding pad of the adjacent bonding pads not being covered by the insulative posts;
a plurality of signal connection members, each signal connection member being attached to only one bonding pad at the second portion of the one bonding pad;
a substrate having a number of electrodes electrically connected to the signal connection members, and the substrate having a number of ball lands electrically connected to the electrodes, wherein the semiconductor chip being flip-chip-bonded to the substrate via the signal connection members;
a filler underfilling a space between the semiconductor chip and the substrate; and
a number of solder balls attached to the ball lands on the lower surface of the substrate.

2. The flip chip bonded package of claim 1, wherein the insulative posts are made of a polymer and each insulative post is capable of buffering external stress.

3. The flip chip bonded package of claim 1, wherein the electrodes of the substrate are designed so as to have a fine pitch.

4. The flip chip bonded package of claim 1, wherein the upper surface of the substrate, except the electrodes, is covered with solder paste.

5. The flip chip bonded package of claim 1, further comprising solder bumps formed on the signal connection members.

6. A flip chip bonded package comprising:
a semiconductor chip having a plurality of bonding pads arranged in two rows on an upper surface in a zigzag pattern;
a plurality of insulative posts, each insulative post being formed on a part of the upper surface of the semiconductor chip between groups of three adjacent bonding pads each insulative post also being formed on a first portion of each bonding pad of the groups of three adjacent bonding pads, wherein a second portion of each bonding pad of the groups of three adjacent bonding pads not being covered by any of the insulative posts;

a plurality of signal connection members, each signal connection member being attached to only one bonding pad at the second portion;

a substrate having a number of electrodes electrically connected to the signal connection members, and the substrate having a number of ball lands electrically connected to the electrodes, wherein the semiconductor chip being flip-chip-bonded to the substrate through the signal connection members;

a filler underfilling a space between the semiconductor chip and the substrate; and a number of solder balls electrically attached to the ball lands of the substrate.

7. The flip chip bonded package of claim 6, wherein the insulative posts are made of a polymer and each is capable of buffering external stress.

8. The flip chip bonded package of claim 6, wherein the electrodes of the substrate are designed so as to have a fine pitch.

9. The flip chip bonded package of claim 6, wherein the upper surface of the substrate, except the electrodes, is covered with solder paste.

10. The flip chip bonded package of claim 6, further comprising solder bumps formed on the signal connection members.

* * * * *